United States Patent
Widner

(10) Patent No.: US 11,252,823 B2
(45) Date of Patent: Feb. 15, 2022

(54) MANUFACTURING METHOD OF MULTILAYER PRINTED CIRCUIT BOARDS

(71) Applicant: Tadco, Inc. LLC, Cle Elum, WA (US)

(72) Inventor: Philip Martin Widner, Cle Elum, WA (US)

(73) Assignee: Tadco, Inc. LLC, Cle Elum, WA (US)

( * ) Notice: Subject to any disclaimer, the term of this patent is extended or adjusted under 35 U.S.C. 154(b) by 136 days.

(21) Appl. No.: 16/749,813

(22) Filed: Jan. 22, 2020

(65) Prior Publication Data

US 2021/0007228 A1 Jan. 7, 2021

(30) Foreign Application Priority Data

Jul. 2, 2019 (TW) ................... 108123335

(51) Int. Cl.
*H05K 3/46* (2006.01)
*H05K 3/00* (2006.01)

(52) U.S. Cl.
CPC ......... *H05K 3/4638* (2013.01); *H05K 3/0008* (2013.01)

(58) Field of Classification Search
CPC ................... H05K 3/0008; H05K 3/4638
See application file for complete search history.

(56) References Cited

U.S. PATENT DOCUMENTS 4,568,971 A * 2/1986 Alzmann .................. B26D 7/01
348/95

FOREIGN PATENT DOCUMENTS

| CN | 1191748 | C | * | 3/2005 |
| CN | 102998309 | A | | 3/2013 |
| JP | 01-016660 | B | * | 3/1989 |
| JP | 2098195 | A | * | 4/1990 |
| JP | 94206997 | A | * | 1/1992 |
| JP | 2602423 | B2 | * | 4/1997 |
| JP | 2006269456 | A | * | 10/2006 |

* cited by examiner

*Primary Examiner* — Carl J Arbes
(74) *Attorney, Agent, or Firm* — Bradley J. Thorson; DeWitt LLP

(57) ABSTRACT

A manufacturing method of multilayer printed circuit boards has steps as follows: aligning circuit layers with a stacking location to form a substrate having multiple positioning portions; pre joining the substrate at the positioning portions; forming an alignment hole in each positioning portion; and placing the pre joined substrate over alignment pins of a press device for lamination. After the circuit layers are aligned, the substrate is pre joined at the positioning portions, and then the alignment holes are formed in the positioning portions for pins alignment at the press device. The alignment accuracy is enhanced. Dusts will not deposit onto surfaces of the circuit layers to damage circuits thereof.

4 Claims, 5 Drawing Sheets

MANUFACTURING METHOD OF MULTILAYER PRINTED CIRCUIT BOARDS

BACKGROUND OF THE INVENTION

1. Field of the Invention

The present invention relates to a manufacturing method of printed circuit boards, and more particularly to a manufacturing method of multilayer printed circuit boards.

2. Description of Related Art

Multilayer printed circuit boards (multilayer PCBs) are applied for electronic appliances in various fields. The multilayer PCBs can have high circuit density to decrease size of the electronic appliances. A conventional manufacturing method of multilayer PCBs is firstly producing multiple single-sided or double-sided circuit plates (circuit layers), then laminating the circuit layers together to form a multilayer PCB with multiple single-sided circuit plates or multiple double-sided circuit plates electrically connected with each other. In the conventional manufacturing method of multilayer PCBs, the circuit layers respectively have multiple alignment holes in the same deployment for alignment. Bonding layers (prepreg layers) have multiple alignment holes in the same deployment to align with the alignment holes of the circuit layers. The circuit layers are individually laid over alignment pins via their alignment holes to fix a laminating position, and the bonding layers are individually placed between each two adjacent circuit layers for bonding the circuit layers. After that, stacked layers mounted over the alignment pins are laminated for bonding the circuit layers.

The alignment holes of the circuit layers and of the bonding layers are respectively formed by drilling or punching before the layup process. Dust and cuttings are generated during drilling or punching, easily attach to the surfaces of the circuit layers and bonding layers, and then deposit onto the surfaces of the circuit layers during the layup process. During the lamination process, the dust and the cuttings deposited on the surfaces of the circuit layers are pressed and will scratch or damage circuits formed on the surfaces of the circuit layers. As each layer is punched or drilled respectively, the machining tolerance makes each layer have alignment holes slightly misaligned, thereby reducing the alignment accuracy. Moreover, as each circuit layer is individually laid on the alignment pins during the layup process, the alignment holes may be enlarged by the alignment pins and thus alignment accuracy is reduced. The circuits formed on the surface of the circuit layers may be damaged by the alignment pins during the layup process. The damage and scratching of the circuit layer surfaces will cause high frequency noise. After conductive vias are formed therein, the conductive vias may be in poor electrical contact with some of the circuit layers to reduce the quality of conduction, if the circuit layers are misaligned.

In another lamination process of multilayer PBCs, the circuit layers are aligned and stacked by an optical alignment system. After that, a positioning point is defined, and the layers are bonded at the positioning point by thermal compression bonding to form a pre joining stack. Then, the pre joining stack is laminated to finish the lamination process.

The optical alignment system can provide high alignment accuracy. However, during the pre joining process, because the layers are only bonded at one single positioning point, the pre joined layers have poor bonding strength and may be detached easily during transport. The circuit layers may displace with respect to one another due to uneven compression force during the lamination process, and the alignment accuracy is reduced.

To overcome the shortcomings, the present invention tends to provide a manufacturing method of multilayer printed circuit boards to mitigate or obviate the aforementioned problems.

SUMMARY OF THE INVENTION

The main objective of the invention is to provide a manufacturing method of multilayer printed circuit boards to solve the misalignment, scratching and damage problems in the manufacture of the multilayer printed circuit boards.

A manufacturing method of multilayer printed circuit boards comprises steps as follows:

preparing multiple circuit layers and at least one bonding layer;

individually aligning and stacking the circuit layers with a stacking location and placing one of the at least one bonding layer between each two of the circuit layers adjacent each other to form a substrate, the substrate having multiple positioning portions defined in the substrate;

bonding the circuit layers at the positioning portions of the substrate by thermal compression bonding to pre-join the circuit layers;

forming an alignment hole through all of the circuit layers and the at least one bonding layer at each positioning portion of the substrate;

placing the substrate over alignment pins of a press device via the alignment holes of the substrate; and laminating the substrate.

Other objects, advantages and novel features of the invention will become more apparent from the following detailed description when taken in conjunction with the accompanying drawings.

DETAILED DESCRIPTION OF PREFERRED EMBODIMENT

Figure 1:
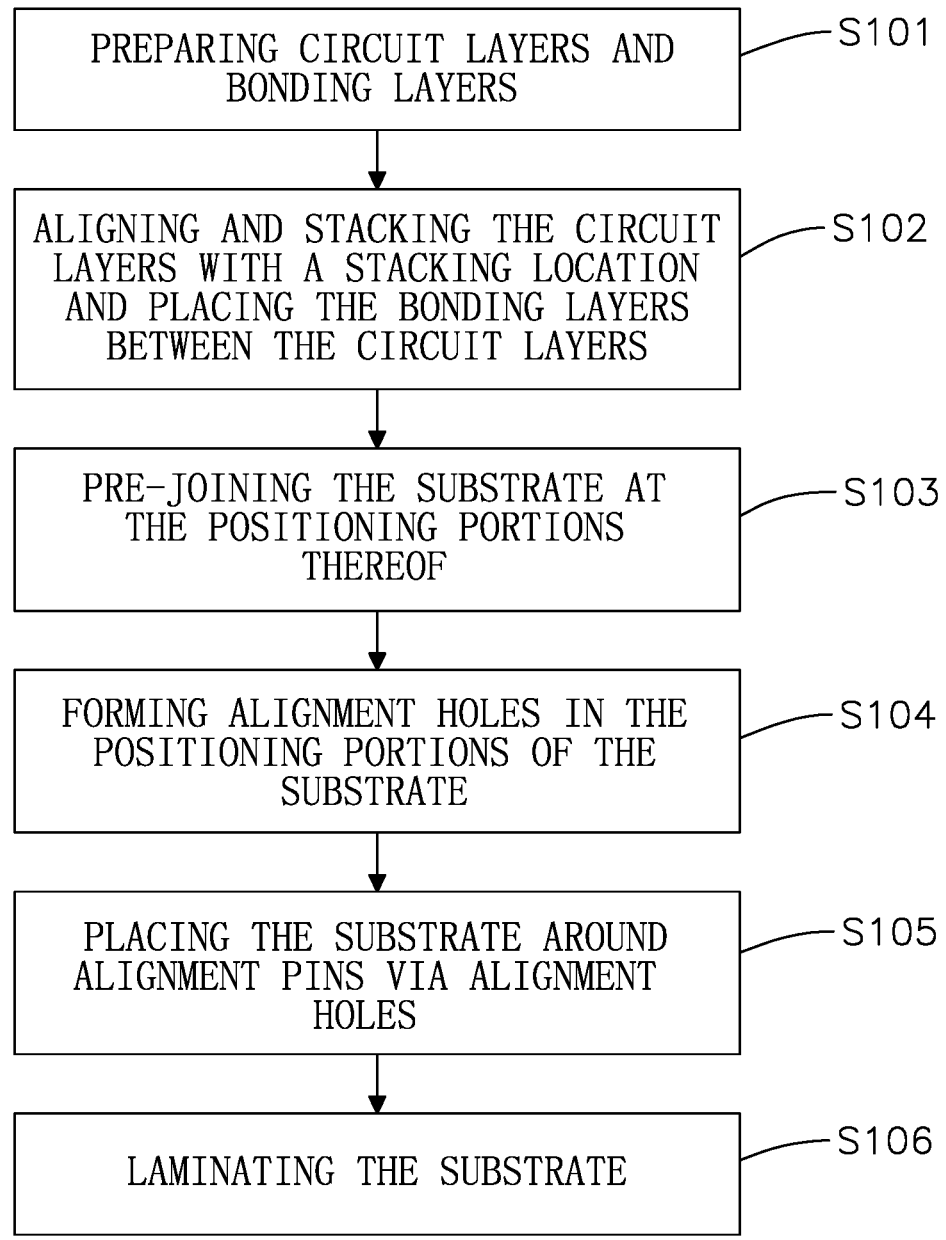
FIG. 1 is a block diagram of a manufacturing method of multilayer printed circuit boards in accordance with the present invention.

With reference to FIGS. 1, 2A to 2C, a manufacturing method of multilayer printed circuit boards (multilayer PCBs) in accordance with the present invention includes steps as follows:

Step 1 (S101): preparing multiple circuit layers (circuit plates) 11 and at least one bonding layer (prepreg layer) 12;

Step 2 (S102): individually aligning and stacking the circuit layers 11 with a stacking location and placing one of the at least one bonding layer 12 between two adjacent circuit layers 11 to form a substrate, the substrate having multiple positioning portions 10 defined therein;

Step 3 (S103): pre joining the substrate at each positioning portion 10;

Step 4 (S104): forming an alignment hole 100 in each positioning portion 10 of the substrate;

Step 5 (S105): placing the substrate over alignment pins 21 of a press device via the alignment holes 100; and Step 6 (S106): laminating the substrate.

Figure 2A:
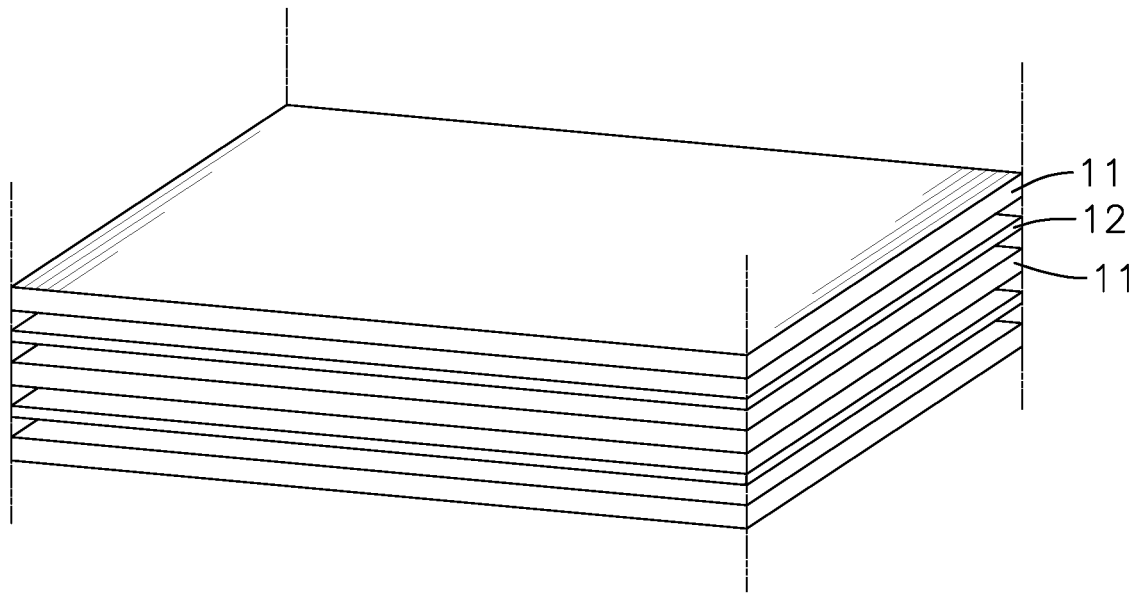
FIGS. 2A to 2C are operational perspective views of the manufacturing method of multilayer printed circuit boards in accordance with the present invention.

With reference to FIG. 2A, in Step 1 (S101) and Step 2 (S102), after the circuit layers 11 and the at least one bonding layer 12 are prepared, the circuit layers 11 are sequentially and accurately aligned and stacked with each other at the stacking location, and one of the bonding layers 12 is placed between two adjacent circuit layers 11 during the stacking process. The bonding layer 12 (pregreg layer) is applied for bonding adjacent circuit layers 11 by a thermal compression bonding process. A number of the at least one bonding layer 12 is one less than a number of the circuit layers 11. Preferably, the circuit layers 11 are optically aligned with each other at the stacking location by an optical arrangement system. The optical arrangement system can facilitate accurate alignment to reduce misalignment between the layers. The positioning portions 10 of the substrate are defined (marked) by an optical positioning process to enhance the alignment accuracy.

Figure 2B:
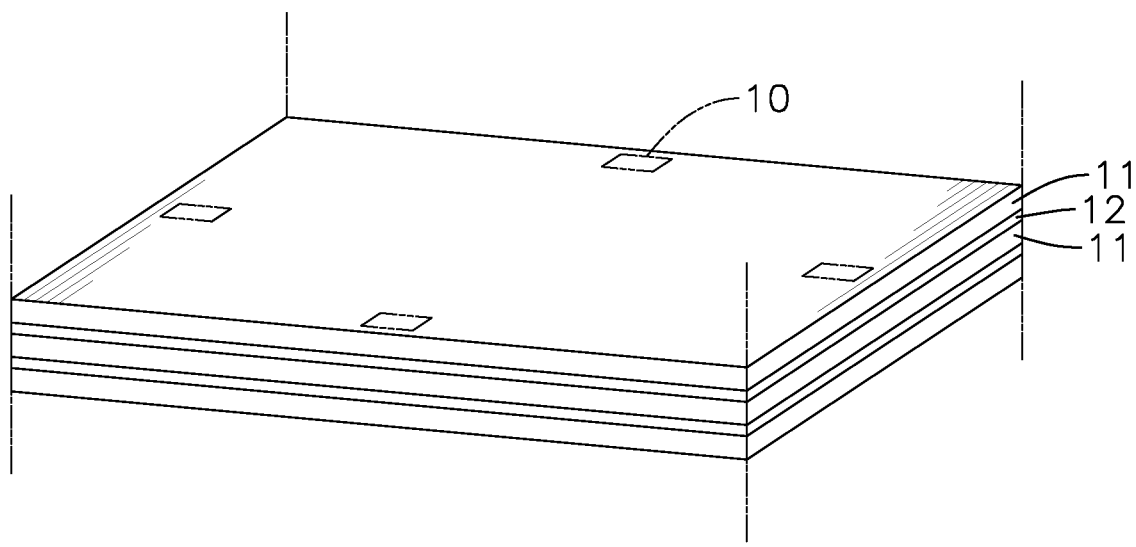

With reference to FIG. 2B, in Step 3 (S103), the circuit layers 11 of the substrate are pre joined at each positioning portion 10. The circuit layers 11 may be pre joined via thermal compression bonding, riveting, or a combination of bonding and riveting.

Figure 2C:
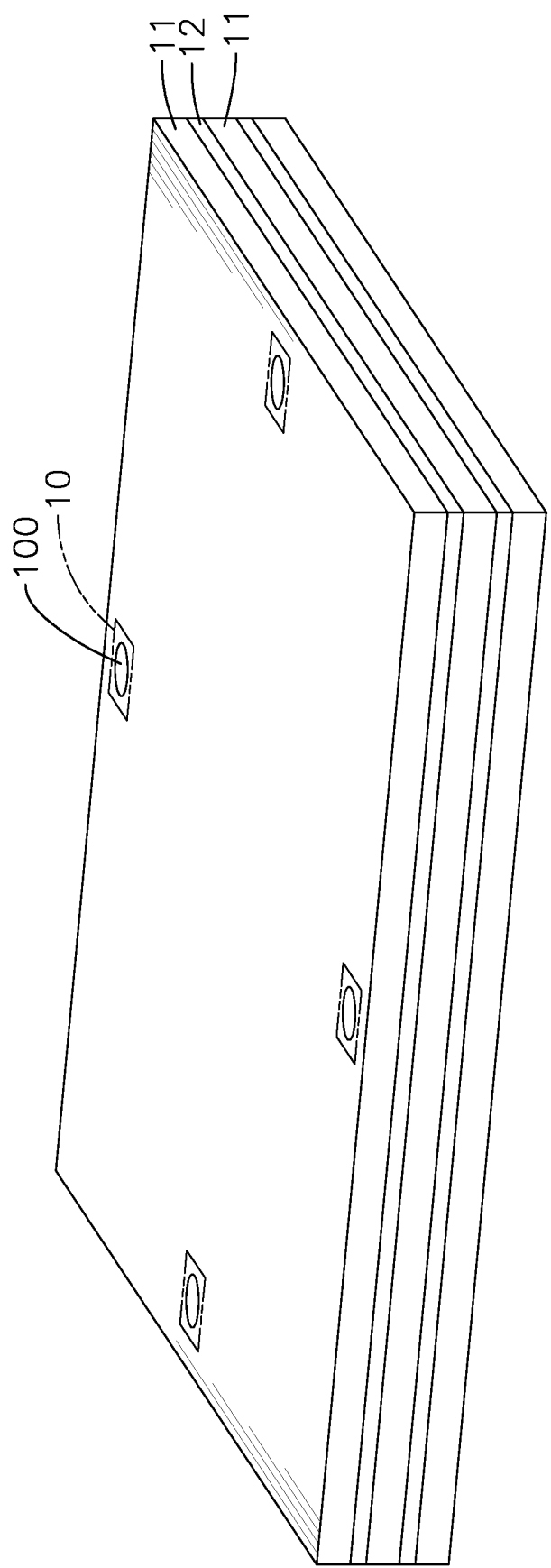

With reference to FIG. 2C, in Step 4 (S104), an alignment hole 100 is formed through all of the circuit layers 11 and the at least one bonding layer 12 in each positioning portion 10 of the substrate, where the circuit layers 11 are pre-joined. The alignment holes 100 may be formed by machining drilling, laser drilling, perforating, or punching. Because the circuit layers 11 of the substrate are pre joined together before formation of the alignment holes 100, the circuit layers 11 and the bonding layers 12 abut against each other closely and are partially joined. Dust and cuttings of the bonding layers 12 (prepreg layers) generated during formation of the alignment holes 100 may not deposit between the surfaces of the adjacent circuit layers 11.

The lamination of the substrate in Step 6 (S106) is processed by thermal compression bonding the substrate to bond the circuit layers 11 and the bonding layers 12 completely. Thus, the circuit layers 11 can be closely laminated in accurate alignment.

Figure 3A:
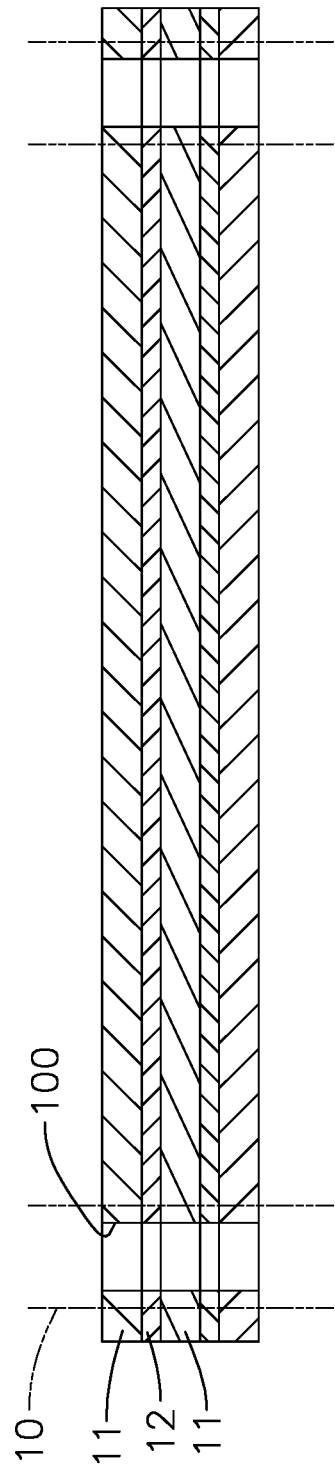
FIGS. 3A and 3B are operational cross sectional side views of the manufacturing method of multilayer printed circuit boards in FIG. 2, showing the substrate being pre joined by bonding.

With reference to FIG. 3A, one of the pre joining methods is bonding the circuit layers 11 of the substrate at the positioning portions 10 by thermal compression bonding. The circuit layers 11 are partially fixed in the positioning portions 10 by thermal compression bonding. The bonding layers 12 partially bond the adjacent circuit layers 11 at the positioning portions 10, before the alignment holes 100, which may be slots or round holes, are formed therein. Thus, dusts and cuttings will fall out from the substrate, and will not deposit between the bonding layers 12 and the circuit layers 11 to damage circuits formed on surfaces of the circuit layers 11.

Figure 3B:
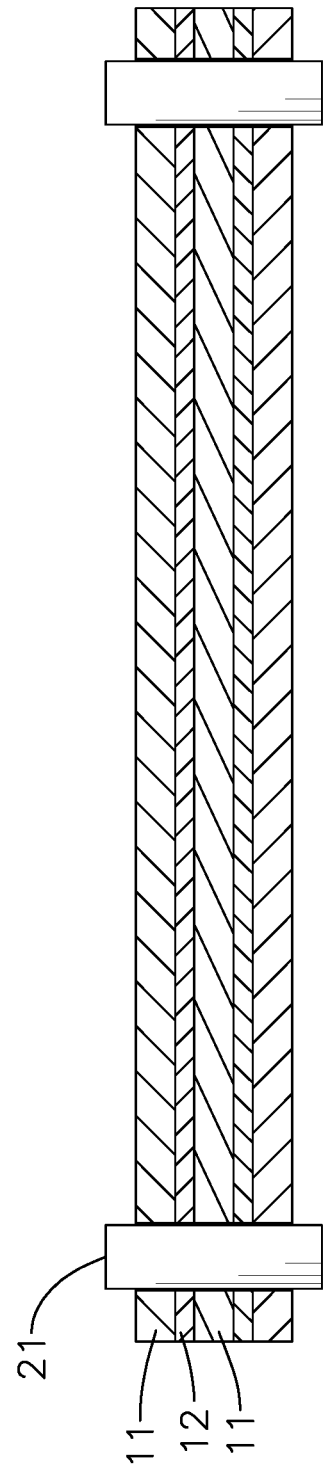

With reference to FIG. 3B, after the alignment holes 100 are formed in the substrate, the substrate is placed over the alignment pins 21 via the alignment holes 100 for the lamination process. The circuit layers 11 of the substrate are completely laminated together by the bonding layers 12. The substrate is partially joined at the positioning portions 10 by thermal compression bonding at the pre joining process, and the integrated substrate is placed over the alignment pins 21 via the alignment holes 100 for further positioning before the lamination process. Thus, the circuit layers 11, which are accurately aligned and stacked by the optical alignment system, can avoid misalignment during the lamination process.

Figure 4A:
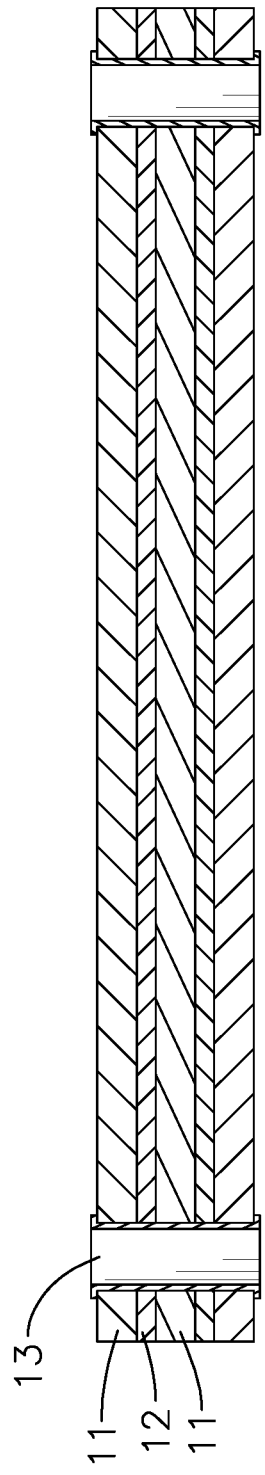
FIGS. 4A and 4B are operational cross sectional side views of the manufacturing method of multilayer printed circuit boards in FIG. 2, showing the substrate being pre joined by riveting.
Figure 4B:
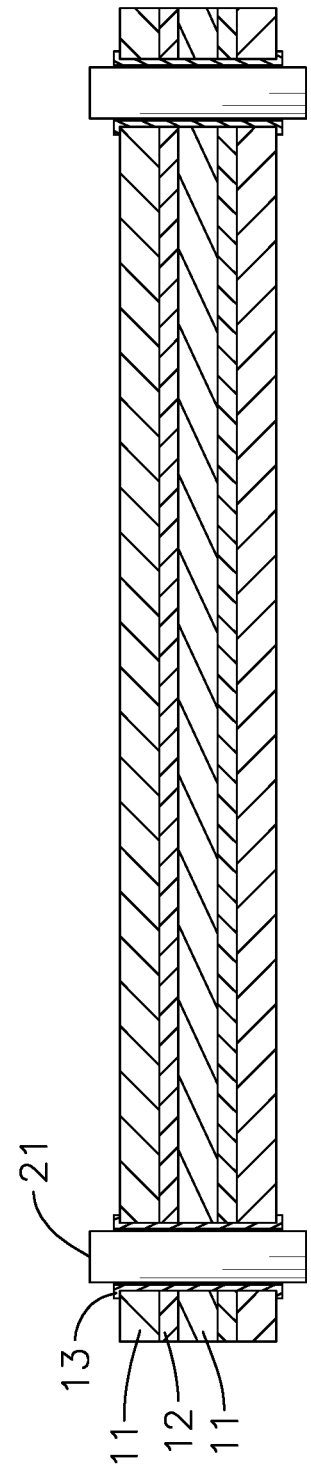

With reference to FIG. 4A, one of the pre joining methods is riveting the circuit layers 11 of the substrate at the positioning portions 10. Rivets 13 are each respectively mounted in the positioning portions 10 for fastening the circuit layers 11. The circuit layers 11 are partially fastened by the rivets 13 to provide a stronger joining strength. Even subjected to a force in parallel, the circuit layers 11 of the substrate will not be displaced relative to one another, thereby ensuring the alignment of the circuit layers 11. Preferably, the rivets 13 are tubular rivets, and the alignment holes 100 can be easily formed through the rivets 13. With reference to FIG. 4B, the alignment holes 100 are formed in the rivets 13 for the alignment pins 21 to mount therethrough. The circuit layers 11 are partially fastened at the positioning portions 10 by riveting. The alignment holes 100 are formed therein after the riveting, and the integrated substrate can be placed over the alignment pins 21 via the alignment holes 100. Thus, after the circuit layers 11 are optically aligned, the circuit layers 11 may not be displaced from the stacked position by external forces during transport or lamination.

One of the pre joining methods is firstly bonding the circuit layers 11 of the substrate at the positioning portions 10 by thermal compression bonding, then riveting the substrate at various locations not at the positioning portions 10 to prevent the circuit layers 11 from slipping during riveting. The alignment accuracy of the circuit layers 11 can be further enhanced.

Preferably, after the pre joining process, the substrate is optically aligned in the tooling machine by an optical alignment system, to ensure the positioning portions 10 are aligned with the respective hole-formation positions defined by the tooling machine. After that, the alignment holes 100 are respectively formed in the positioning portions 10 by the tooling machine.

The stacking alignment of the circuit layers 11 is done by the optical alignment system. The optical alignment system can provide high alignment accuracy to ensure the circuit layers 11 are accurately aligned with each other. The positioning portions 10 are defined (marked) by the optical alignment system, and the circuit layers 11 are partially joined at the positioning portions 10 during the pre joining process. After that, the alignment holes 100 are respectively formed in the positioning portions 10 for placing the substrate on the alignment pins 21 via the alignment holes 100 before the lamination process. The positioning portions 10 are defined by the optical alignment system, which can provide accurate positioning. The alignment holes 100 can be accurately aligned with corresponding alignment pins 21.

The substrate is partially joined and the bonding layers 12 are placed within the circuit layers 11 before the formation of the alignment holes 100. The alignment holes 100 are formed in the integrated substrate by drilling, punching, or perforating, instead of being respectively formed in the individual circuit layers 11 and the bonding layers 12 by drilling, punching, or perforating. Dusts and cuttings generated during drilling or punching may not deposit onto the surfaces of the inner circuit layers 11. The circuits of the circuit layers 11 can avoid scratching and damage by the dusts and the cuttings. The alignment holes 100 formed in the integrated substrate can enhance the positioning accuracy. Moreover, as the substrate is partially joined, the substrate can be integrally placed over the alignment pins 21, instead of being individually placed over the alignment pins 21 layer by layer. The damage to the edges of the alignment holes 100 and circuits formed on the surfaces of the circuit layers 11 can be reduced.

With the manufacturing method of the present invention, the optical alignment after pre joining the substrate reduces the tolerance incurred from layer-to-layer alignment. Welding or bonding in the positioning portions 10 where the alignment holes 100 are formed will reduce dust from the bonding layer 12 (prepreg layer). Drilling the alignment holes 100 after optical alignment will improve accuracy of the layer-to-layer alignment. The whole substrate is installed on the alignment pins 21, already assembled and alignment holes added so damage from processing is reduced. The whole substrate is more stable during the final lamination process.

What is claimed is:

1. A manufacturing method of multilayer printed circuit boards comprising steps as follows:
    preparing multiple circuit layers and at least one bonding layer;
    individually aligning and stacking the circuit layers with a stacking location and placing one of the at least one bonding layer between each two of the circuit layers adjacent each other to form a substrate, the substrate having multiple positioning portions defined in the substrate;
    bonding the circuit layers at positioning portions of the substrate by thermal compression bonding to pre-join the circuit layers;
    forming an alignment hole through all of the circuit layers and the at least one bonding layer at each positioning portion of the substrate;
    placing the substrate over alignment pins of a press device via the alignment holes of the substrate; and
    laminating the substrate.

2. The manufacturing method as claimed in claim 1, wherein after the circuit layers are pre-joined at the positioning portions of the substrate by thermal compression bonding, the substrate is riveted at multiple locations not at the positioning portions.

3. The manufacturing method as claimed in claim 1, wherein after the circuit layers are pre-joined, the substrate is optically aligned in a tooling machine, and then the alignment holes are formed through all of the circuit layers and the at least one bonding layer at the positioning portions by the tooling machine.

4. The manufacturing method as claimed in claim 2, wherein the substrate is riveted by tubular rivets.

* * * * *